United States Patent
Dvir

(12) 
(10) Patent No.: US 6,212,961 B1
(45) Date of Patent: Apr. 10, 2001

(54) BUFFER SYSTEM FOR A WAFER HANDLING SYSTEM

(75) Inventor: Eran Dvir, Givatavim (IL)

(73) Assignee: NOVA Measuring Instruments Ltd., Rehovot (IL)

( * ) Notice: Subject to any disclaimer, the term of this patent is extended or adjusted under 35 U.S.C. 154(b) by 0 days.

(21) Appl. No.: 09/248,070

(22) Filed: Feb. 11, 1999

(51) Int. Cl.⁷ ........................................................ G01N 1/00
(52) U.S. Cl. .............................................................. 73/865.8
(58) Field of Search .................................. 73/863, 865.8; 324/754, 758, 761

(56) References Cited

U.S. PATENT DOCUMENTS

| | | |
|---|---|---|
| 4,308,586 | 12/1981 | Coates . |
| 4,328,553 | 5/1982 | Fredriksen et al. . |
| 4,475,122 | 10/1984 | Green . |
| 4,516,855 | 5/1985 | Korth . |
| 4,555,767 | 11/1985 | Case et al. . |
| 4,585,348 | 4/1986 | Chastang et al. . |
| 4,618,262 | 10/1986 | Maydan et al. . |
| 4,647,207 | 3/1987 | Bjork et al. . |
| 4,653,924 | 3/1987 | Itonaga et al. . |
| 4,681,450 | 7/1987 | Azzam . |
| 4,713,140 | 12/1987 | Tien . |
| 4,815,856 | 3/1989 | Bruce . |
| 4,826,321 | 5/1989 | Coates et al. . |
| 4,842,410 | 6/1989 | Darrah et al. . |
| 4,873,430 | 10/1989 | Juliana et al. . |
| 4,908,508 | 3/1990 | Dubbeldam . |
| 4,910,549 | 3/1990 | Sugita . |
| 4,957,368 | 9/1990 | Smith . |
| 4,974,919 | 12/1990 | Muraki et al. . |
| 4,999,014 | 3/1991 | Gold et al. . |
| 5,042,951 | 8/1991 | Gold et al. . |
| 5,061,072 | 10/1991 | Folkard et al. . |
| 5,109,430 | 4/1992 | Nishihara et al. . |
| 5,120,966 | 6/1992 | Kondo . |
| 5,159,412 | 10/1992 | Willenborg et al. . |
| 5,166,752 | 11/1992 | Spanier et al. . |
| 5,181,080 | 1/1993 | Fanton et al. . |
| 5,274,575 | 12/1993 | Abe . |
| 5,333,052 | 7/1994 | Finarov . |
| 5,420,680 | 5/1995 | Isobe . |
| 5,438,209 | 8/1995 | Yamamoto et al. . |
| 5,438,413 | 8/1995 | Mazor et al. . |
| 5,604,344 | 2/1997 | Finarov . |
| 5,682,242 | 10/1997 | Eylon . |
| 5,825,913 | 10/1998 | Rostami et al. . |

FOREIGN PATENT DOCUMENTS

| | | |
|---|---|---|
| 0558 781 A1 | 9/1993 | (EP) . |
| 59-125009 | 7/1984 | (JP) . |
| 01 054 207 | 6/1989 | (JP) . |

OTHER PUBLICATIONS

C.P. Ausschnitt, M.E., Lagus, "Seeing the Forest for the Trees: A New Approach for CD Control", SPIE, vol. 3332, p–2112–220, 1998.

Equipe Technologies, DBM 2400 Series Robots for 300mm Wafers—Technical Literature (1 page).

Cybec Systems, Per4Mer 6100 Robot—Technical Literature (1 page).

Primary Examiner—Robert Raevis
(74) Attorney, Agent, or Firm—Eitan, Pearl, Latzer & Cohen-Zedek

(57) ABSTRACT

A processing unit for processing at least one semiconductor wafer includes a processing station for processing the wafer, a measuring station for measuring the at least one water, a robot for moving the wafer between the processing and measuring stations, a wafer handling system and a buffer station. The wafer handling system operates in conjunction with the measuring station and moves the wafer to and from a measuring location on the measuring unit. The buffer station is associated with the wafer handling system and receives measured and unmeasured wafers thereby to enable the robot to arrive at and leave the measuring station with at least one wafer thereon.

6 Claims, 16 Drawing Sheets

BUFFER SYSTEM FOR A WAFER HANDLING SYSTEM

CROSS-REFERENCE TO RELATED APPLICATIONS

This application is related to U.S. patent application Ser. No. 09/097,298, filed Jun. 12, 1998 and assigned to the common assignees of the present invention.

FIELD OF THE INVENTION

The present invention relates to handling and robotics systems, in general, and to such in semiconductor processing control systems, in particular.

BACKGROUND OF THE INVENTION

Reference is made to FIG. 1 which illustrates a prior art process environment 10 in a semiconductor fabrication plant. In general, process environment 10 comprises a processing unit 2, such as a chemical mechanical polisher, at least one load/unload cassette station 4 (two are shown), an integrated metrology tool 6 and a robot 8.

The robot 8 transfers wafers to and from both the processing unit 2 and the cassette stations 4. However, the integrated metrology tool 6 requires its own handling system in order to transfer the wafer to be measured from the robot 8 to a measuring location on tool 6 and vice versa.

FIGS. 2A, 2B, 2C, 2D, 2E and 2F illustrate the operation of tool 6 and robot 8 using a handling system 16 to work with an integrated metrology tool having a measuring unit 15. One exemplary process environment uses the NovaScan 210 integrated metrology tool, commercially available from Nova Measuring Instruments Ltd. of Rehovot, Israel, and its handling system. The handling system 16 is composed of a bent arm 17 connected to a gripper 18. The latter can be any gripper which can hold a wafer. For example, it can be a vacuum gripper.

The arm 17 slides vertically on a vertical rail 14 and reaches above the measuring unit 15 in order to place a new wafer in a measuring position and/or to return a measured wafer to the robot 8. Between the uppermost position of gripper 18 and measuring unit 15 there is a supporting station 19 comprised of two supporting beams 24 and 25, each of which has a supporting base 26. Supporting beams 24 and 25 are connected to a rail 30 by a relative motion unit 32. Unit 32 is designed to provide relative motion to supporting beams 24 and 25 such that they move toward and away from each other, as indicated by arrows 34 and 36. Supporting station 19 is connected to the measuring unit 15 by a solid connector 54.

As shown in FIG. 2B, with supporting beams 24 and 25 in their most separated positions, gripper 18 can freely pass through the buffer station 22, even when loaded with a wafer. As shown in FIG. 2C, with supporting beams 24 and 25 in their closest positions, a wafer can be held on each of supporting base 26 and gripper 18 cannot pass through.

In operation, and as shown in FIG. 2D, the robot 8 arrives at integrated tool 6 loaded with a new wafer W on an arm 9. At this point, handling system 16 is waiting in its uppermost position. Robot 8 places the wafer W on supporting bases 26, after which, as shown in FIG. 2E, handling system 16 moves down and picks up the wafer W. Robot 8 then leaves integrated tool 6 to conduct other missions while handling system 16, loaded with the wafer W, continues down, until, as shown in FIG. 2E, it places the wafer, working surface down, in a measuring position on the measuring unit 15. Typically, the measuring position includes supports which support the wafer on its edges (not shown). Since supporting beams 24 and 25 have moved towards and away from the plane of the paper, the supporting station 19 is shown in FIG. 2F with dashed lines.

It is noted that robot 8 leaves tool 6 empty and must arrive at tool 6 unloaded in order to take back a measured wafer. Thus, robot 8 is not optimally exploited, i.e., a disadvantage considering that the robot 8 is the "bottle neck" in process environment 10 (FIG. 1).

Prior art systems solve this problem in multiple ways. One exemplary robot is the DBM 2400 series of Equipe Technologies, Mountain-View, Calif., USA. This robot has two separate arms. A secondary exemplary robot is the PerMer 6100 robot of Cybeq Systems, Sunnyvale, Calif., USA. The robot can hold two wafers, one on each side of its arm, and rotates the arm 180 degrees in order to switch wafers. For both prior art systems, the robot arrives at the supporting station loaded with a new wafer, and the free arm or side faces the supporting station. The free arm (side) loads a processed wafer from the supporting station, after which, the arm (side) with the new wafer is loaded onto the supporting station. The robot then returns loaded with the processed wafer.

It will be appreciated that these solutions require additional footprint since, during their operation, the two arms (sides) are loaded with both now and processed wafers. This may be a drawback in crowded processing environments.

SUMMARY OF THE INVENTION

It is therefore an object of the present invention to overcome the aforementioned limitations of the prior art.

There is therefore provided, in accordance with a preferred embodiment of the present invention, a buffer station for a wafer handling system. The handling system has a general path along which it moves when handling the wafer and the buffer station includes at least one pair of supporting elements and a motion unit. The supporting elements together are capable of supporting at least two wafers therebetween and they are located so as to support the wafers within the general path. The motion unit provides relative motion to the supporting elements such that, in a first mode, the supporting elements support any of the wafers placed thereon within the general path and, in a second mode, the supporting elements are sufficiently separated so as not to disturb the motion of the handling system when the handling system holds a wafer. Typically, the supporting elements include at least two supporting bases each capable of holding a wafer thereon when the supporting elements are in the first mode.

Alternatively, in accordance with a preferred embodiment of the present invention, the buffer station includes at least two pairs of supporting elements each capable of supporting at least one wafer therebetween and located so as to support the wafer within the general path and one motion unit per pair of supporting elements. The motion unit shifts its associated pair of supporting elements in and out of the general path and, when said supporting elements are in the general path, provides the relative motion to its associated pair of supporting elements described hereinabove.

Additionally, each supporting element includes at least one supporting base each capable of holding a wafer thereon when the supporting elements are in the first mode.

There is also provided, in accordance with a preferred embodiment of the present invention, a processing unit for processing at least one semiconductor wafer. The unit includes a processing station for processing the wafer, a measuring station for measuring the wafer, a robot for moving the wafer between the processing and measuring stations, a wafer handling system and a buffer station. The wafer handling system operates in conjunction with the measuring station and moves the wafer to and from a measuring location on the measuring unit. The buffer station is associated with the wafer handling system and receives measured and unmeasured wafers. This enables the robot to arrive at and leave the measuring station with at least one wafer thereon. The buffer station can be any of the buffer stations described hereinabove.

Additionally, in accordance with a preferred embodiment of the present invention, the buffer station also includes a unit which enables the robot and the wafer handling system to operate generally independently of each other.

Further, in accordance with a preferred embodiment of the present invention, the processing unit also includes a pre-alignment unit movably locatable within a general path of the wafer handling system. Alternatively, the pre-alignment unit can be tilted with respect to a general path of the wafer handling system.

Still further, the buffer station additionally operates as a centering station for aligning a center of the at least one wafer with a center of the measurement location.

Moreover, in accordance with a preferred embodiment of the present invention, the robot includes a unit which simultaneously carries at least two wafers and the buffer station includes a unit which supports at least two wafers.

Additionally, in accordance with a preferred embodiment of the present invention, the processing station is one of the following types of processing stations: chemical-mechanical polisher, phototrack, exposure tool, etching equipment, physical vapor deposition tool and chemical vapor deposition tool.

Moreover, in accordance with a preferred embodiment of the present invention, the measuring unit is an integrated tool.

Further, in accordance with a preferred embodiment of the present invention, the buffer station includes one buffer unit. Alternatively, the buffer station includes at least two buffer units each of which is movable into and out of a general path of the wafer handling system. Alternatively, the buffer station includes three buffer units each of which is movable into and out of a general path of the wafer handling system. For the latter embodiment, the three buffer units include first, second and third buffer units are separated by a predetermined distance and wherein the robot has two arms separated by the predetermined distance.

Finally, there is also provided, in accordance with a preferred embodiment of the present invention, a pre-alignment unit for a wafer measuring unit wherein the pre-alignment unit is tilted with respect to a plane of the wafer.

BRIEF DESCRIPTION OF THE DRAWINGS

The present invention will be understood and appreciated more fully from the following detailed description taken in conjunction with the appended drawings in which.

DETAILED DESCRIPTION OF THE PRESENT INVENTION

The present invention provides a handling system for an integrated monitoring tool which includes a buffer station. Thus, the robot operation becomes less dependent or even independent of the operation of the integrated monitoring tool, generally resulting in increased throughput.

The present invention can be applied to any type of integrated monitoring tool. The term "integrated monitoring tool", as used herein, refers to a monitoring (e.g., metrology, inspection) apparatus that is preferably physically installed inside a processing unit or attached to it. However, it can also be separated form the processing unit, as necessary. The monitoring tool is usually dedicated to the specific processing unit and wafers are preferably transferred to the apparatus by the same robot which serves the processing unit. As mentioned hereinabove, one exemplary integrated monitoring tool is the NovaScan 210, but the present invention incorporates any other integrated monitoring tool.

Furthermore, the present invention can be applied to any processing environment where a wafer is to be unloaded by a robot at a location (e.g., stand along metrology or inspection tool) from which the same wafer should later be reloaded by a robot, the same one or otherwise.

The processing unit to which the integrated monitoring tool is attached can be any processing unit in a fabrication plant. For example, it can be a chemical mechanical polisher, such as those manufactured by Strasbaugh Inc. of San-Luis-Obispo, Calif., by Applied Materials Inc. of Santa Clara, Calif., or a phototrack manufactured by SVG Silicon Valley Group of San-Jose, Calif., or by FSI International of Chaska, Minn., all of the USA. The processing unit can also be an etching, physical vapor deposition unit or chemical vapor deposition unit.

Figure 1:
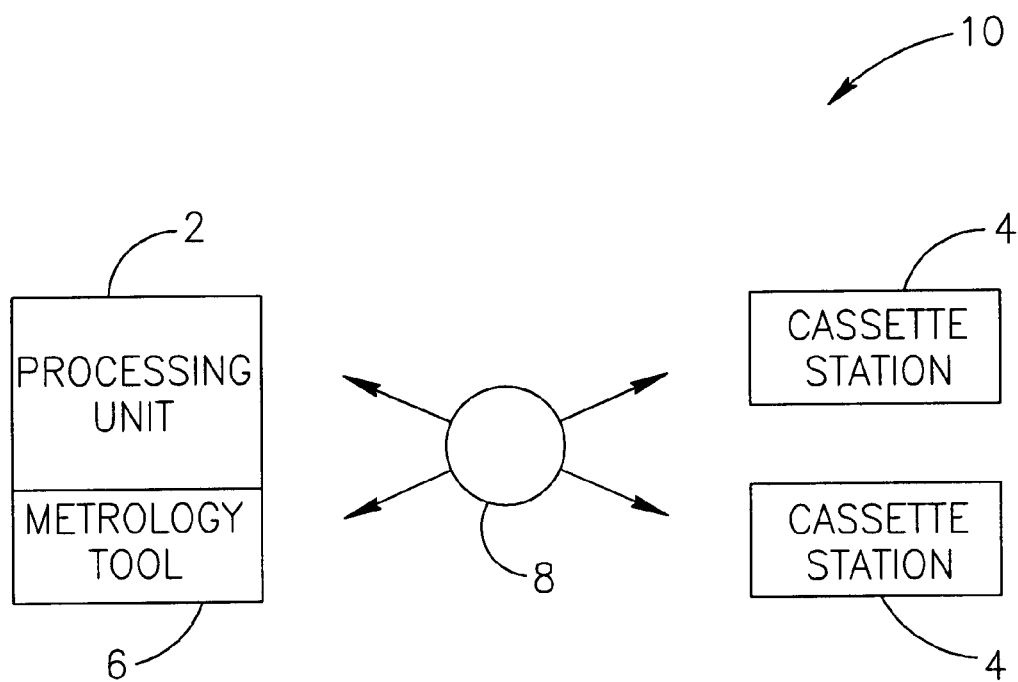
FIG. 1 is a schematic illustration of a prior art process environment in a semiconductor fabrication plant.
Figure 2A:
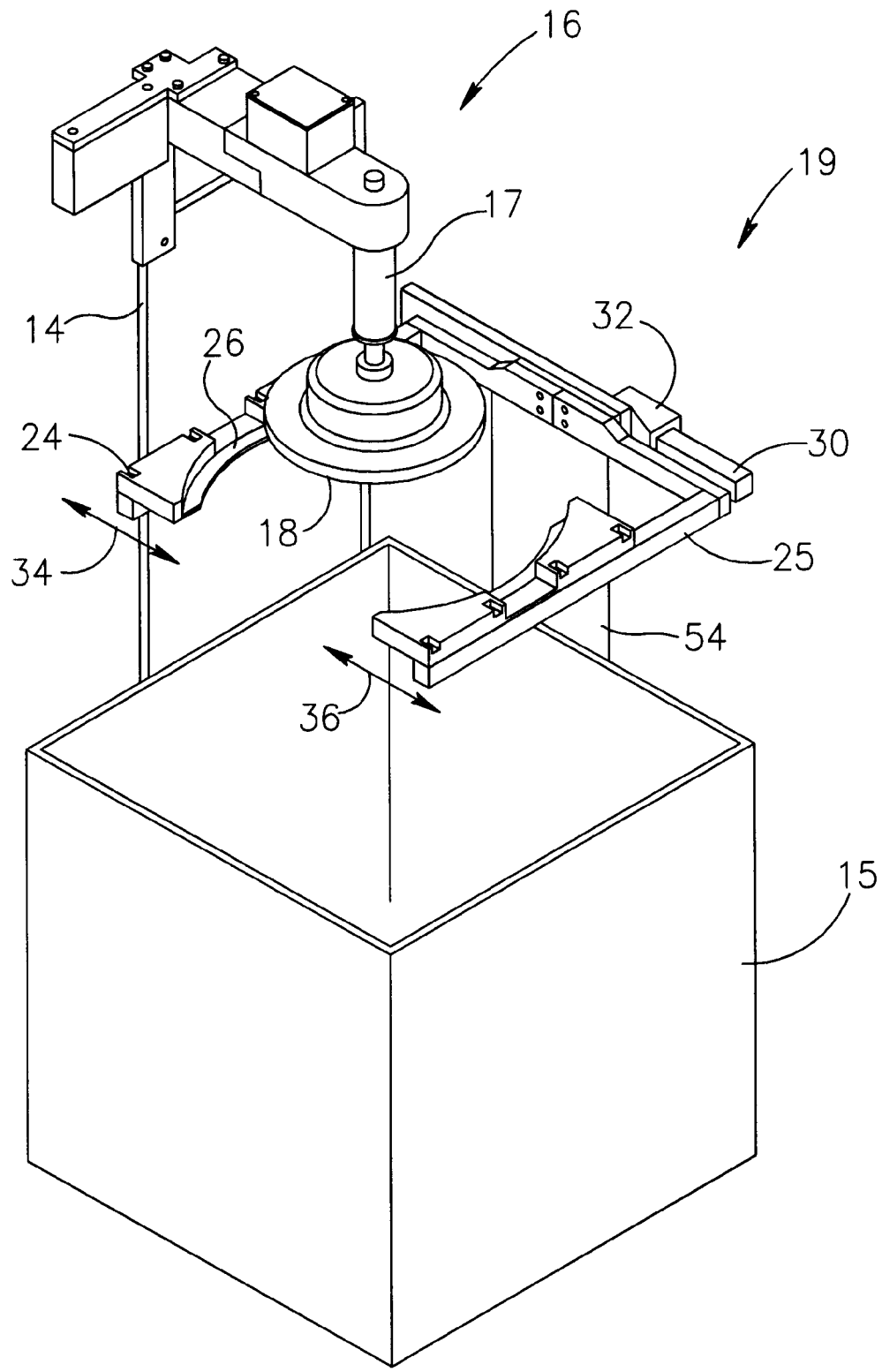
FIGS. 2A, 2B, 2C, 2D, 2E and 2F are schematic illustrations of an integrated metrology tool and its handling system during prior art operation with a robot.
Figure 2B:
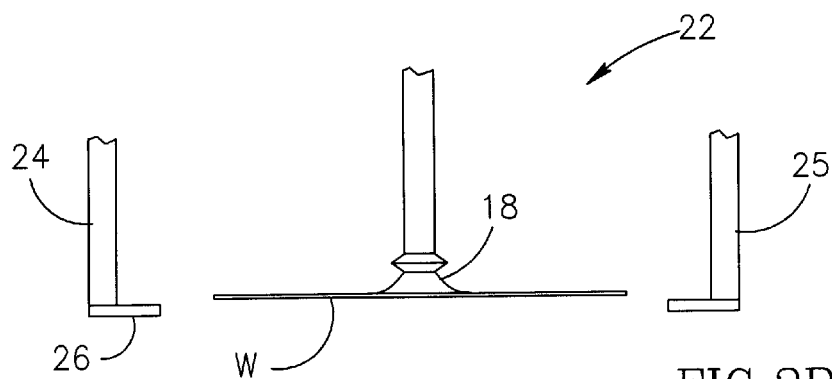
Figure 2C:
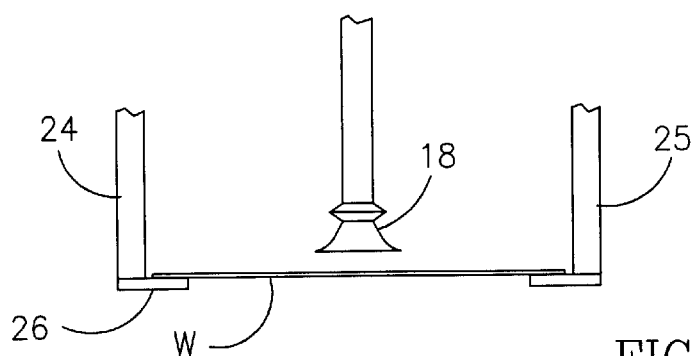
Figure 2D:
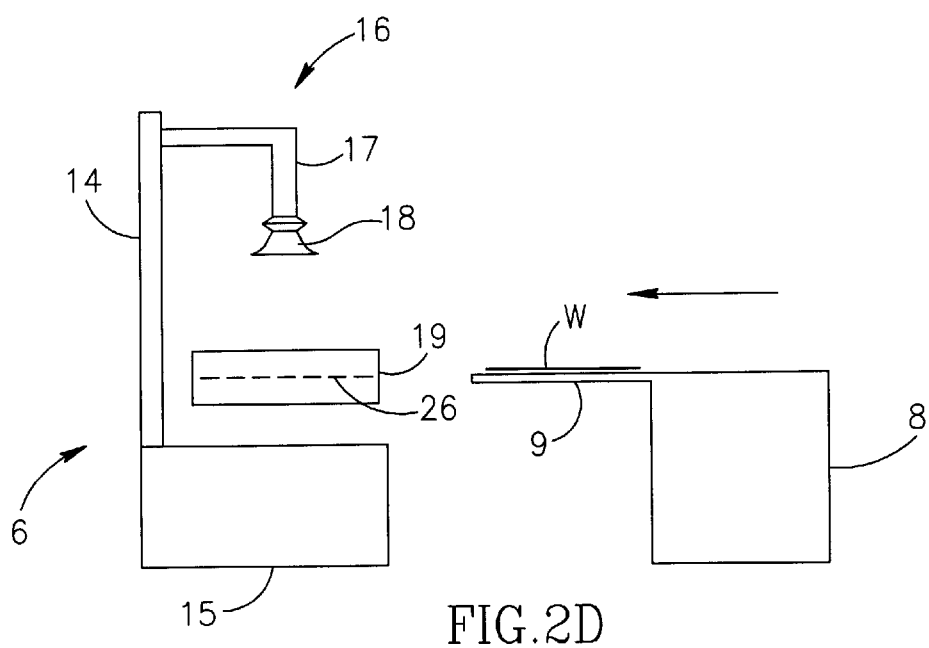
Figure 2E:
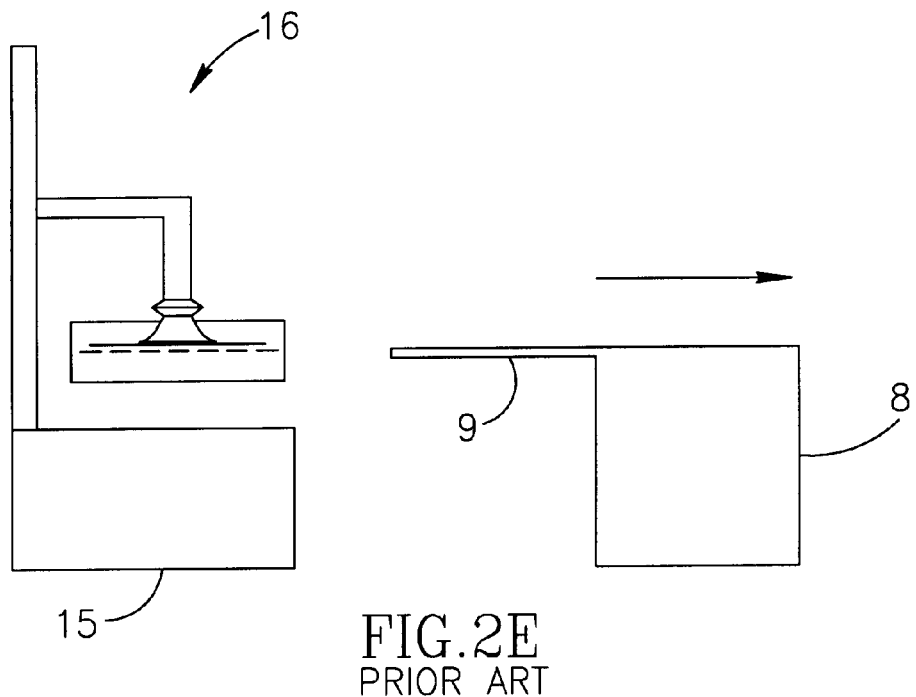
Figure 2F:
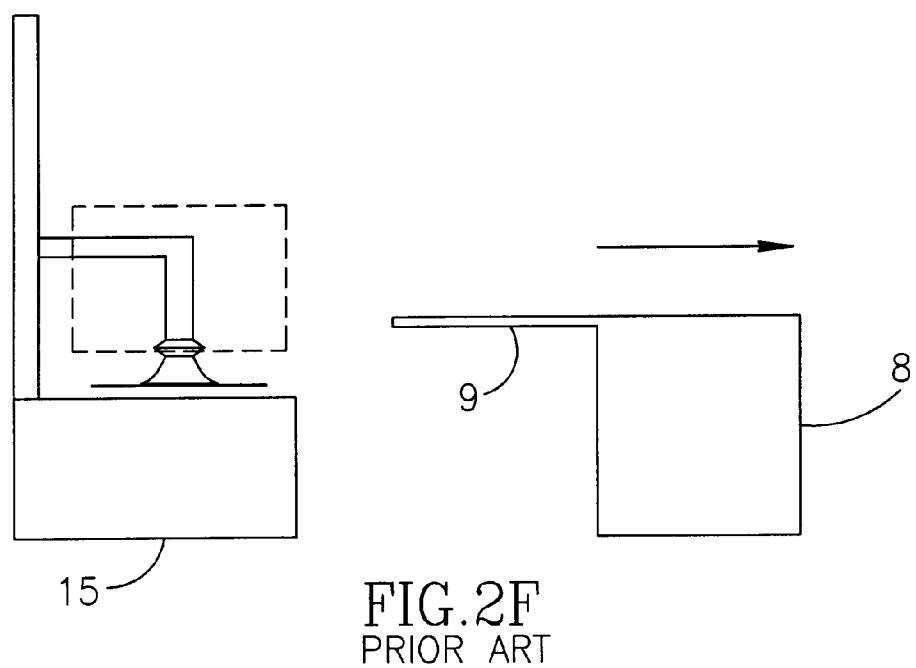
Figure 3A:
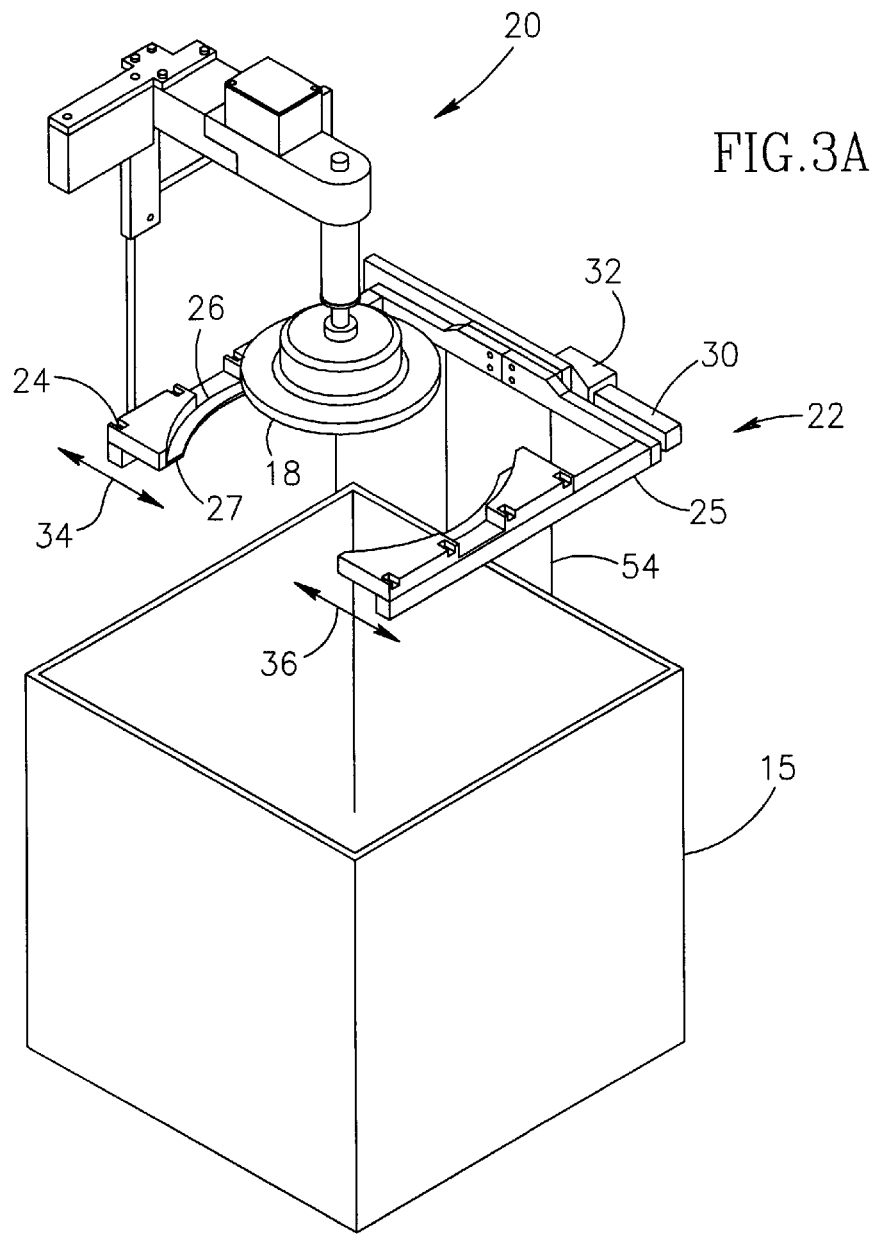
FIG. 3A is a schematic illustration of an integrated monitoring tool and handling system, constructed and operative in accordance with a preferred embodiment of the present invention.
Figure 3B:
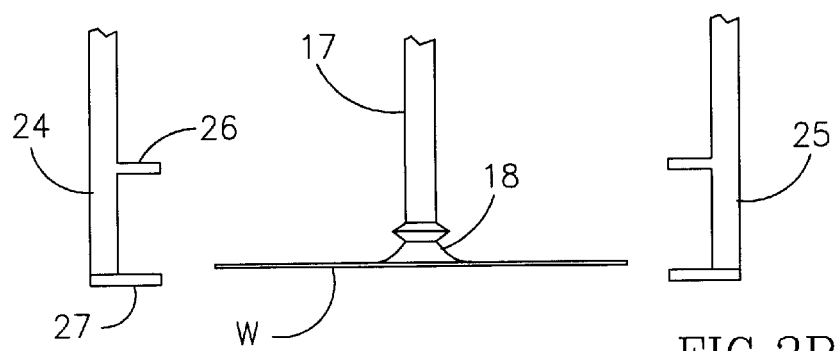
FIG. 3B is a schematic illustration of a buffer station forming part of the handling system of FIG. 3A.

Reference is made to FIGS. 3A and 3B which respectively illustrate a handling system 20 for the integrated tool, constructed and operative in accordance with a preferred embodiment of the present invention, and a buffer station 22 forming part of the handling system 20. FIG. 3A is an isometric illustration of the handling system and FIG. 3B is a schematic front view of buffer station 22. FIG. 3 also shows elements discussed previously and thus, similar reference numerals refer to similar elements.

The handling system 20 is similar to that described in FIG. 2 and thus, will not be described herein in more detail. Buffer station 22 is similar to supporting station 19 and comprises two supporting beams 24 and 25. However, in accordance with a preferred embodiment of the present invention, buffer station 22 has two supporting bases 26 and 27, detailed in FIG. 3B, rather than a single base 26 as in the prior art. This enables buffer station 22 to buffer wafers such that a standard, one-armed (i.e. single end-effector) robot can arrive with a new wafer and can return with a processed wafer, rather than arriving or returning empty, as in the prior art.

Similarly to supporting station 19, supporting beams 24 and 25 are connected to rail 30 by relative motion unit 32. Unit 32 enables supporting beams 24 and 25 to move toward and away from each other, as indicated by arrows 34 and 36.

Figure 4A:
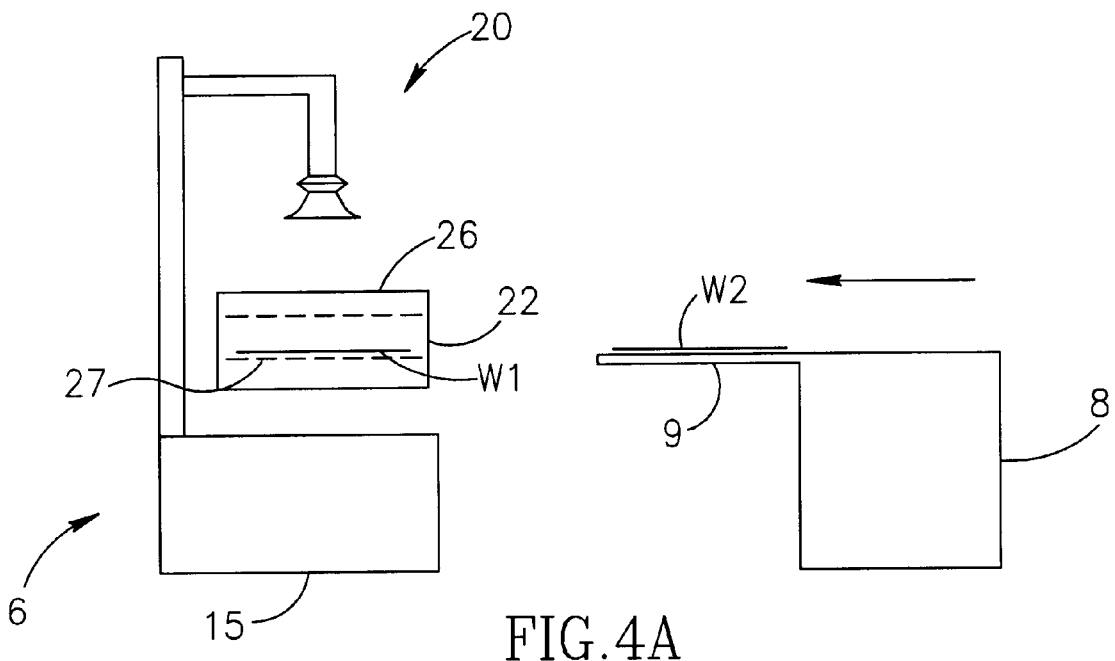
FIGS. 4A, 4B and 4C are schematic illustrations indicating the operation of the system of FIG. 3A.
Figure 4B:
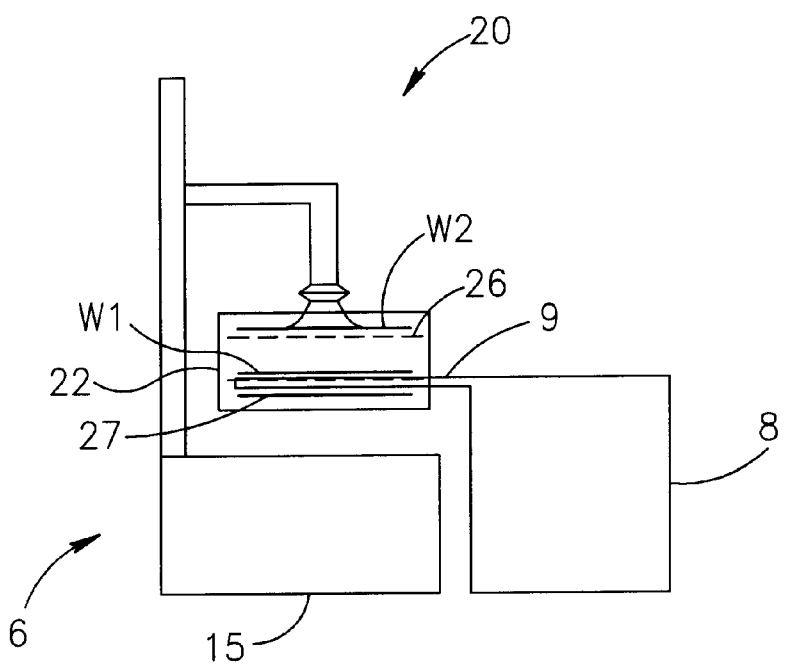
Figure 4C:
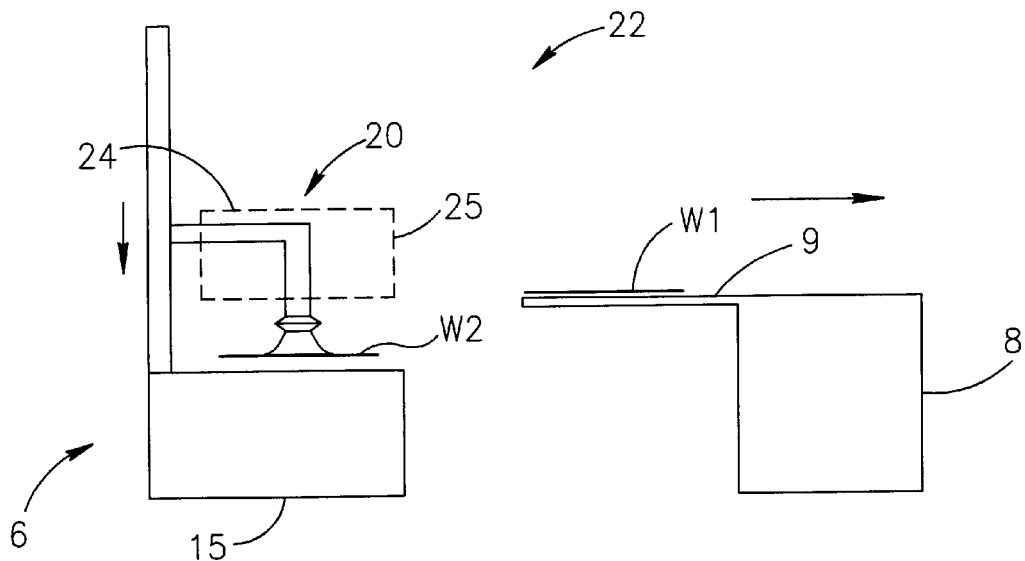

Reference is made to FIGS. 4A, 4B and 4C which are schematic side views of handling system 20 of FIG. 3 with robot 8 and illustrate their combined operation.

As illustrated in FIG. 4A, a measured wafer W1 is present in buffer station 22 on the lower supporting bases 27. At the same time, robot 8 arrives (or is already waiting) with a wafer W2, to be measured by measuring unit 15, and places it onto upper supporting bases 26.

From this point in time, robot 8 and handling system 20 can independently operate, as illustrated in FIG. 4B. Handling system 20 loads new wafer W2 from upper supporting bases 26. Before the robot 8 finishes loading the measured wafer W1, the handling system 20 can start centering and/or pre-aligning the wafer W2, as discussed in more detail hereinbelow. Generally simultaneously, robot 8 loads measured wafer W1 onto its arm 9 from lower supporting bases 27. At the next stage, shown in FIG. 4C, robot 8 leaves tool 6 with measured wafer W1 while handling system 20 can lower new wafer W2, through the now open supporting beams 24 and 25 of buffer station 22, towards and on measuring unit 15. Since, in FIG. 4C, supporting beams 24 and 26 have moved towards and away from the plane of the paper, the buffer station 22 is shown with dashed lines.

It will be appreciated that buffer station 22 provides the following advantages:

1) It enables robot 8 to unload a wafer to be measured and to load a measured wafer, in one visit to integrated tool 6. This minimizes robot movements and thus, saves time.
2) Since buffer station 22 is mounted on handling system 20, no additional footprints is needed for buffer station 22. However, it should be noted that, if no footprint limitations exist, the buffer station of the present invention can be located out of the moving path of the gripper. This requires that the gripper have an additional translation mechanism (not shown) in order to reach the buffer station.

Applicants have realized that, in addition to buffering, buffer station 22 provides the ability to center the wafers prior to placing them on measuring unit 15. This is illustrated in FIGS. 5A and 5B to which reference is now made.

Figure 5A:
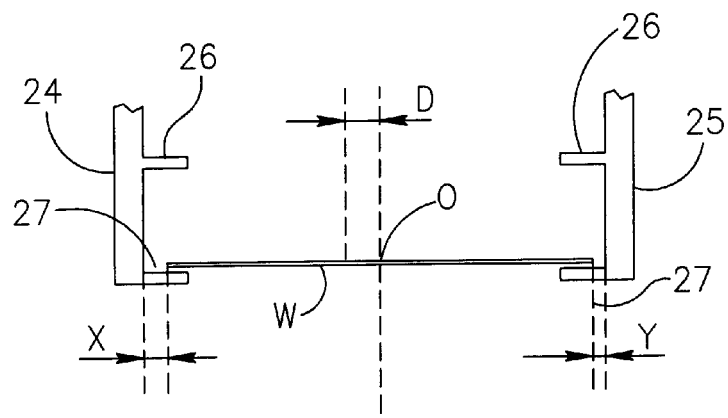
FIGS. 5A and 5B are schematic illustrations indicating a centering operation of the system of FIG. 3A.

FIG. 5A illustrates supporting beams 24 and 25 after robot 8 has placed wafer W on supporting bases 27 but before beams 24 and 25 have reached their closest positions. Typically, robot 8 does not accurately place wafer W and thus, a center O of wafer W is shifted by a distance D from its desired measurement or processing location. Typically, robot 8 places wafer W unevenly such that, between the edges of wafer W and supporting beams 24 and 25 are typically gaps x and y, respectively, where:

$$D \leq x+y$$

Figure 5B:
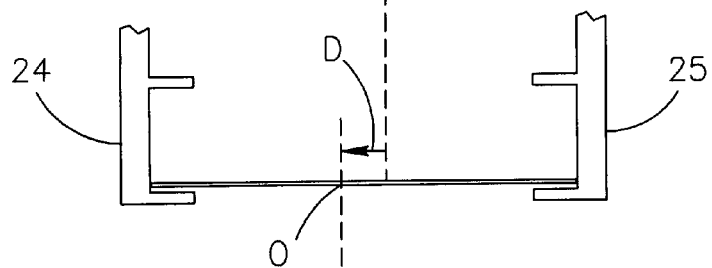

However, as supporting beams 24 and 25 move towards their closest positions, shown in FIG. 5B, they push wafer W between them. Since buffer 22 is mounted on handling system 20 so that the centers of the circles defined by supporting bases 26 and 27 are aligned with the center of the measuring position, once supporting beams 24 and 25 arrive at their final position, the center O of wafer W will be at the desired location. This is shown in FIG. 5B.

Figure 6A:
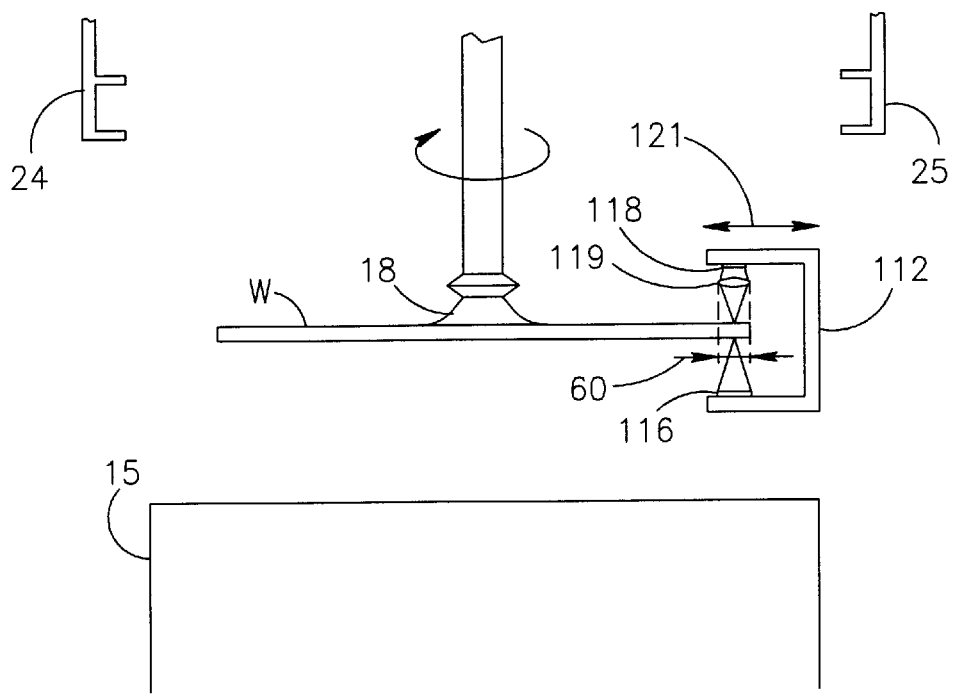
FIGS. 6A and 6B are two schematic illustrations of an alternative embodiment of the integrated monitoring tool of the present invention having a pre-alignment unit, in two different stages of operation.
Figure 6B:
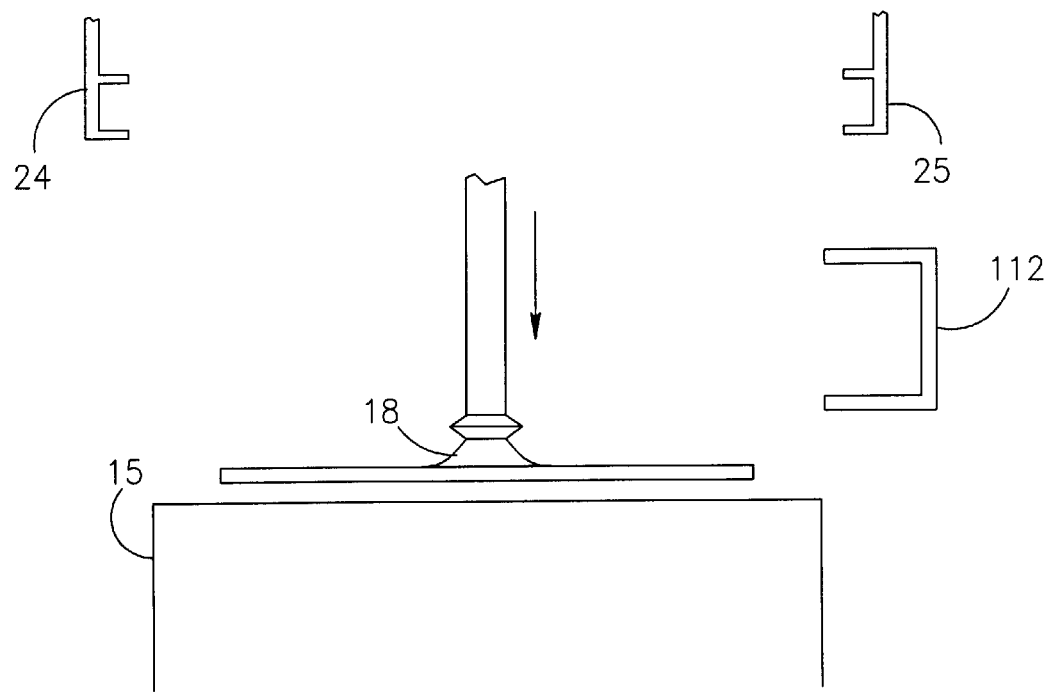

In an alternative embodiment of the present invention, another type of wafer orientation, known as pre-alignment, can be performed in the vicinity of buffer station 22, although this requires additional equipment. Reference is now made to FIGS. 6A, and 6B which illustrate this alternative embodiment in two different states, to FIGS. 6C and 6D which are useful in understanding the operation of the embodiment of FIGS. 6A and 6B and to FIGS. 7A and 7B which provide an alternative embodiment of the pre-alignment unit.

In this embodiment of the present invention the handling system additionally includes a pre-alignment unit 112 located along the path of gripper 18. In FIGS. 6A and 6B, pre-alignment unit 112 is located between buffer station 22 and measurement unit 15. Pre-alignment unit 112 is similar to that described in U.S. patent application Ser. No. 09/097, 298, assigned to the common assignees of the present invention and incorporated herein by reference. Accordingly, the details of operation of pre-alignment unit 112 will not be described herein.

As discussed in U.S. patent application Ser. No. 09/097, 298, pre alignment unit 112 detects the presence of a marker which is standardly present on wafers. Such a marker can be a flat line (a "flat") crossing a small portion of the edges of the wafer or a notch and is used to define the fiducial axis of the wafer.

Pre-alignment unit 112 is a moveable opto-couple detector, focused on the edge of wafer W, which comprises a point illuminator 116, such as a light emitting diode (LED), a single photodiode 118, a photodiode lens 119 and a translation mechanism, indicated by arrow 121. The translation mechanism holds pre-alignment 112 and moves it into and out of its place above the wafer edge.

FIG. 6A shows pre-alignment unit 112 in a first, detecting position, surrounding an edge area 60 of the wafer and FIG. 6B shows pre-alignment unit 112 in a second, non-detecting position away from the path of gripper 18.

Figure 6C:
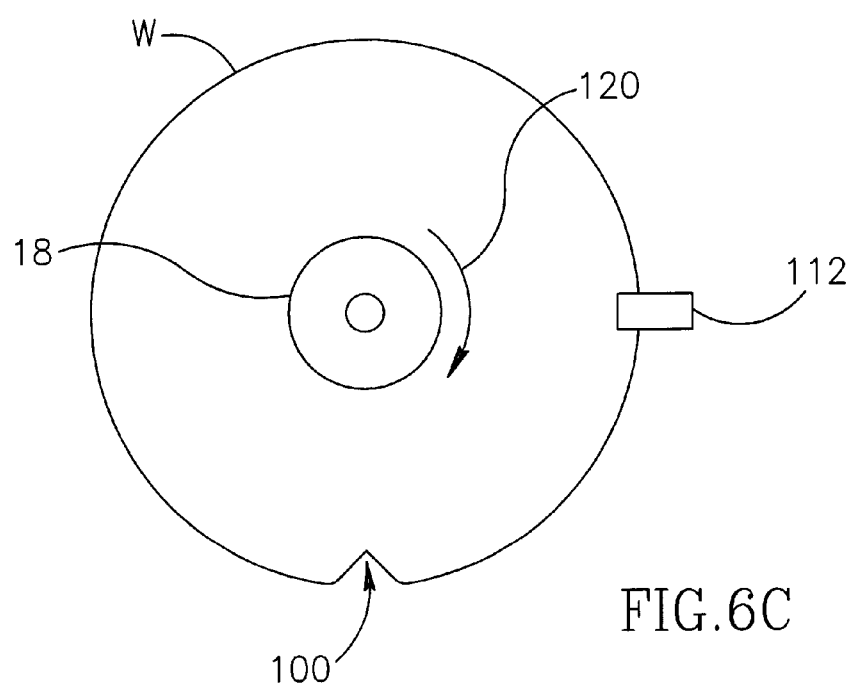
FIGS. 6C and 6D are schematic illustrations of a wafer in various stages of alignment, useful in understanding the operation of the pre-alignment unit of FIGS. 6A and 6B.

While buffer station 22 is in its open position, gripper 18 holds wafer W at the height of pre-alignment unit 112. Pre-alignment unit 112 is then brought into the first position shown in FIG. 6A. FIG. 6C illustrates the original arbitrary orientation of the wafer W. As indicated by arrow 120 in FIG. 6C, gripper 18 rotates the wafer W until a marker 100

(e.g., a flat or a notch) passes the pre-alignment unit 112 which then indicates such to the integrated monitoring tool's control unit (not shown).

Figure 6D:
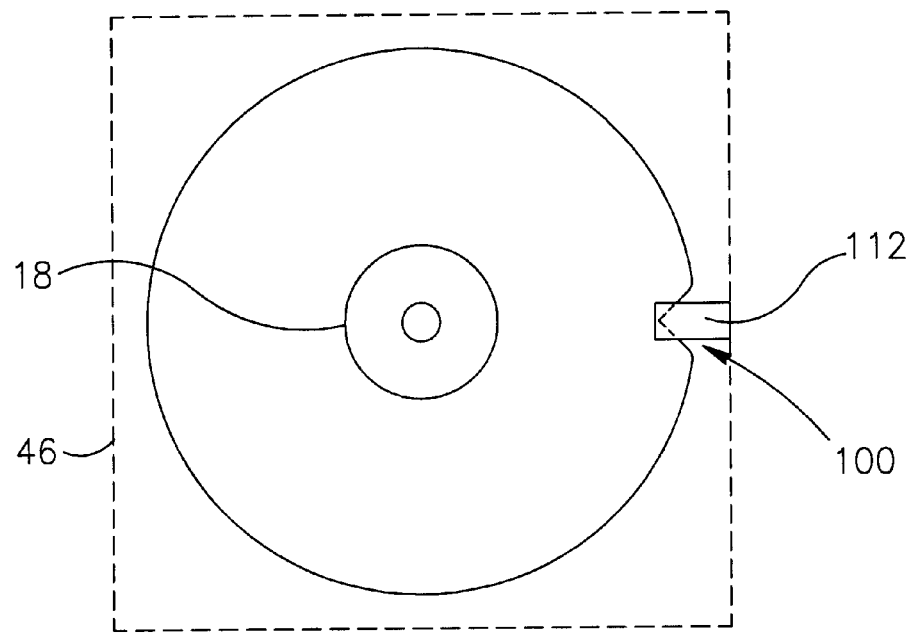

Specifically, the point illuminator 116 illuminates the bottom side of the edge area 60 of the wafer W whereas the single photodiode 118 detects signals above the edge area 60. Whenever the marker is not located between the elements of the pre-alignment unit 112, no light from the point illuminator 116, above a predetermined threshold level, can reach the photodiode 116. However, once the photodiode 118 detects a significant signal, i.e., the marker is between the elements of the detector 112, the control unit stops the rotation of gripper 18. The wafer W is now in a generally known position, near the detector 112 as shown in FIG. 6D, although its precise orientation is still unknown.

The pre-alignment unit 112 is now returned to the side, as shown in FIG. 6B, and, typically, gripper 18 brings the now pre-aligned wafer W to measurement unit 15.

Figure 7A:
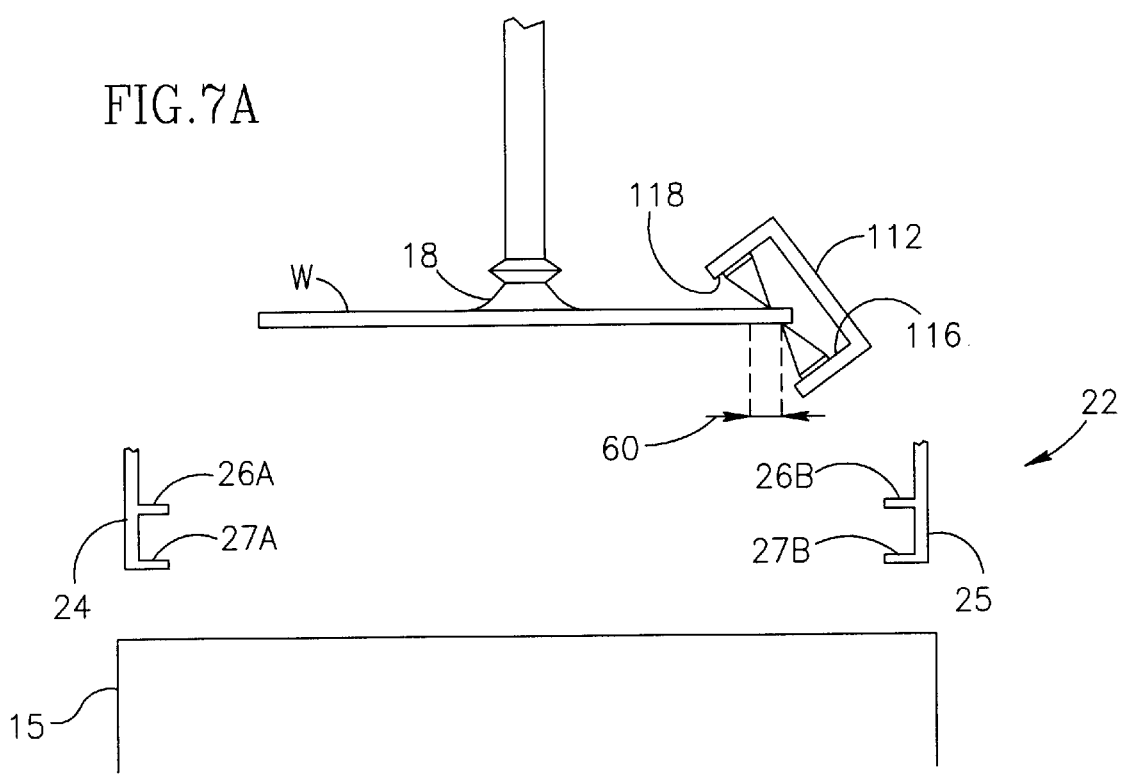
FIGS. 7A and 7B are schematic illustrations of an alternative embodiment of the pre-alignment unit, in two different stages of operation.
Figure 7B:
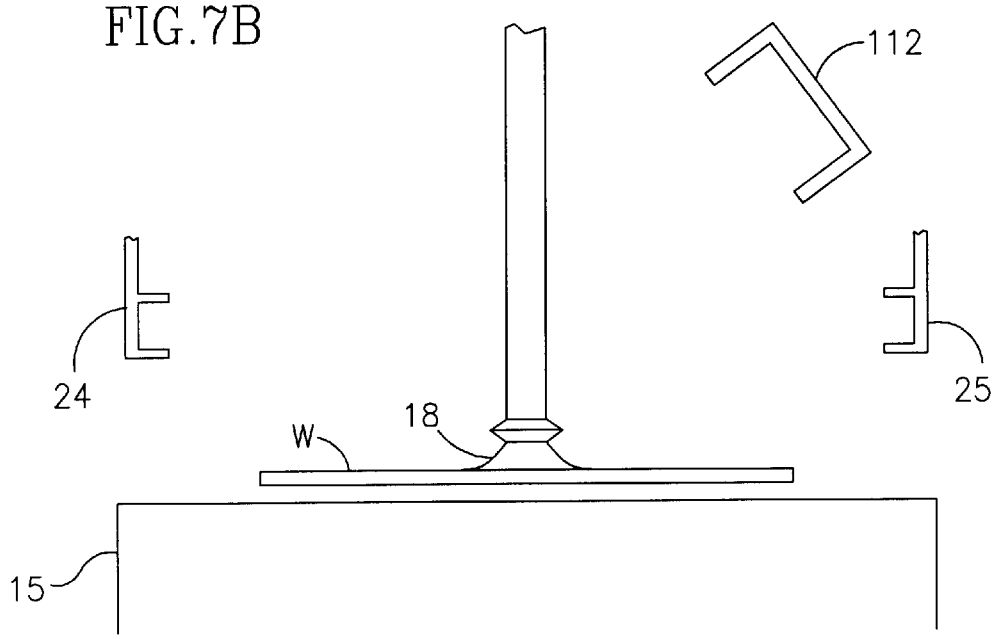

FIGS. 7A and 7B illustrate another preferred embodiment of the pre-alignment unit 112 which eliminates the need to insert and remove the pre-alignment unit 112 to and from the gripper's 18 translation path. FIG. 7A shows a configuration in which buffer station 22 is located between measuring unit 15 and pre-alignment unit 112. Pre-alignment unit 112 is tilted and located in a position above the uppermost position of gripper 18. This position is the furthest position from measuring unit 15.

Gripper 18 first takes the wafer W (generally, an unmeasured wafer) from upper supporting bases 26 and brings it into pre-alignment unit 112. Since pre-alignment unit 112 is tilted such that its lower half is away from the path of gripper 18, wafer W does not hit anything during this operation.

When gripper 18 is in its uppermost position, point illuminator 118 illuminates the bottom side of the edge area 60 of the wafer W while photodiode 118 detects signals above the edge area 60. When pre-alignment is completed, gripper 18 lowers the wafer, away from pre-alignment unit 112, through the now open buffer station 22, to measuring unit 15, as shown in FIG. 7B. Once again, since pre-alignment unit 112 is tilted, gripper 18 can move wafer W into and out of unit 112 without unit 112 having to move.

It is noted that the buffer station 22 can be used with an integrated monitoring tool in which the measuring unit is located above the handling system. However, for this alternative embodiment, supporting means 24 and 25 should be placed so that their supporting bases 26 and 27 face the measuring unit rather than as in the previous embodiment. Pre-alignment unit 112 would then be below buffer station 22, in the location furthest from measuring unit 15.

Figure 8:
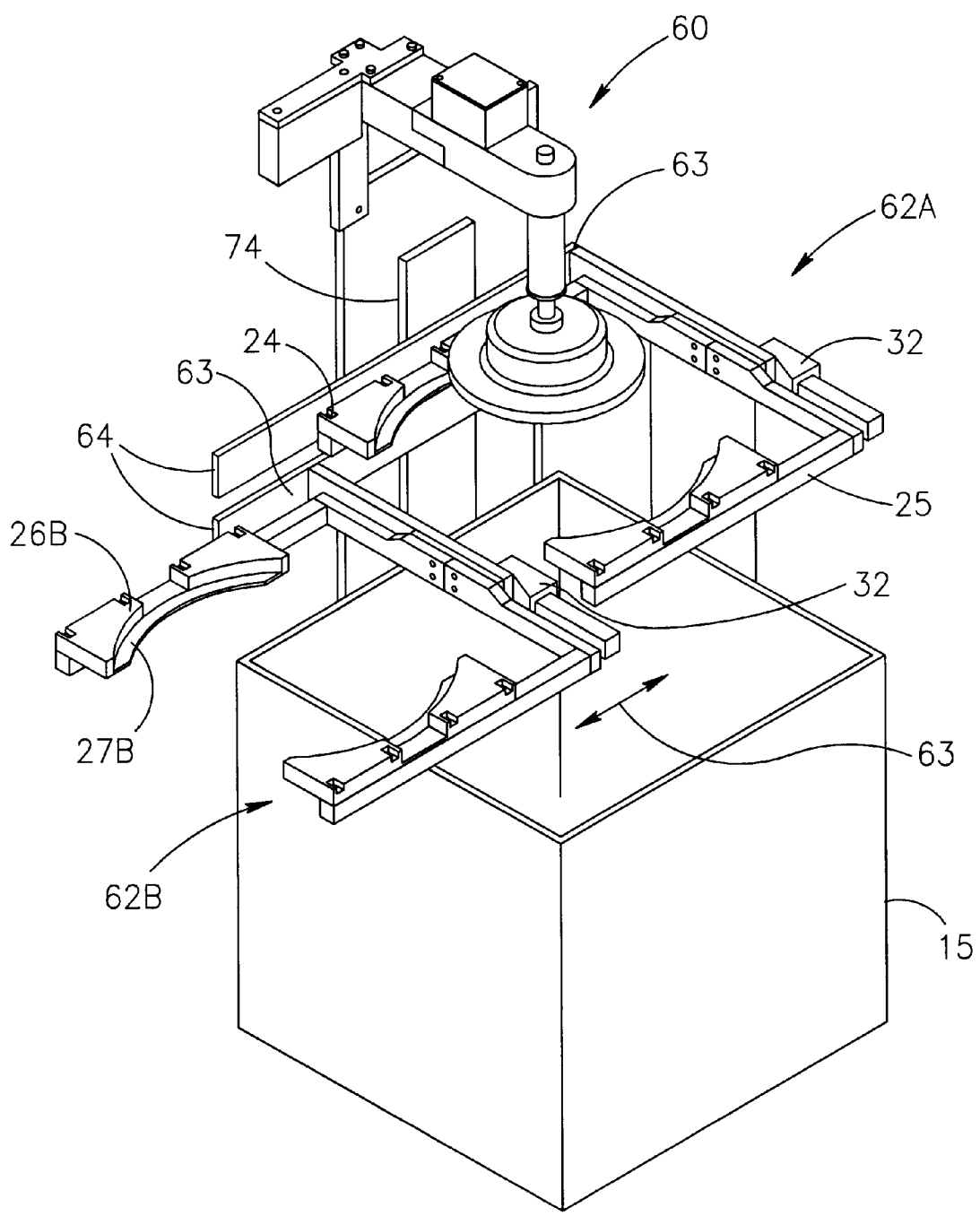
FIG. 8 is a schematic illustration of integrating monitoring tool and handling system having two buffer stations, constructed and operative in accordance with an alternative preferred embodiment of the present invention.
Figure 9A:
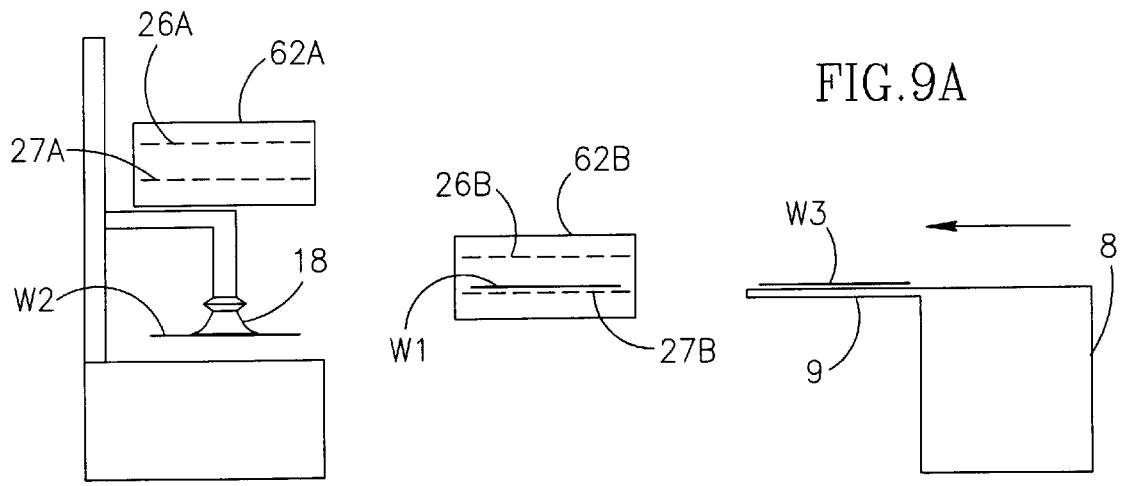
FIGS. 9A, 9B and 9C are schematic illustrations indicating the operation of the system of FIG. 8.
Figure 9B:
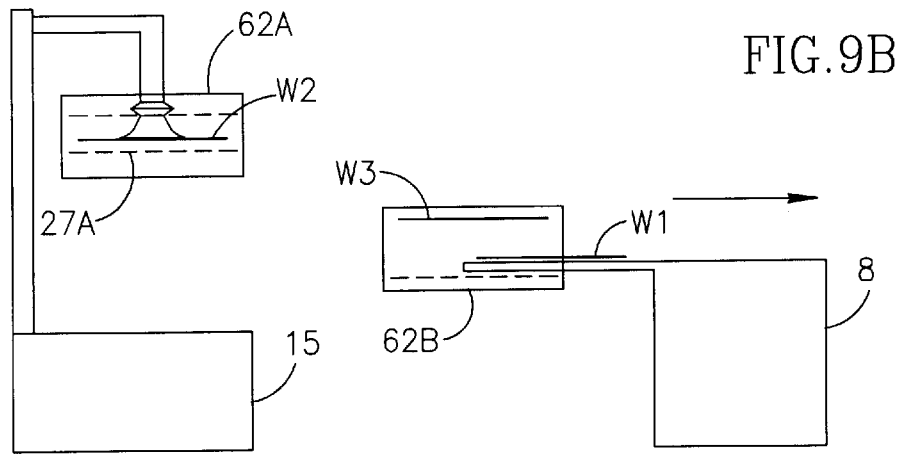
Figure 9C:
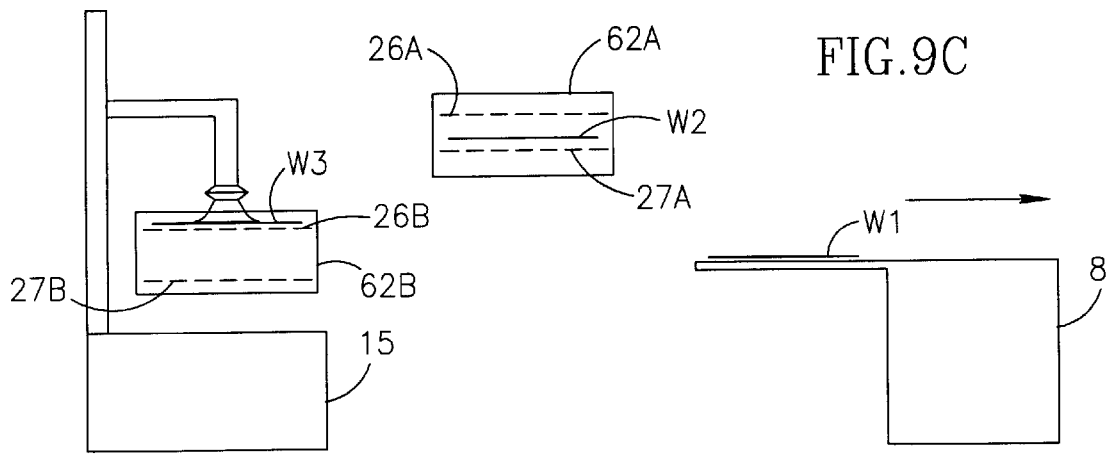

Reference is made to FIG. 8 which illustrates a handling system 60 according to another preferred embodiment of the present invention having a buffer station with two pairs of supporting arms 62A and 62B. Similar reference numbers refer to similar elements. Reference is also made to FIGS. 9A, 9B and 9C which illustrate the combined operation of handling system 60, buffer stations 62A and 62B and the robot 8.

As in the previous embodiment, pairs of supporting arms 62A and 62B can be located above measuring unit 15 and, typically, they have elements similar to those of buffer station 22. However, in this embodiment, each pair of supporting arms 62A and 62B is separately movable away from the path of gripper 18, as indicated by arrow 63, typically via a side rail 64 which is controlled by a motor (not shown). Thus, FIG. 8 shows arms 62A within the path of gripper 18 while arms 62B are out of the path. As in the previous embodiment, each pair of supporting arms 62A and 62B includes relative motion mechanism 32 which separates supporting beams 24 and 25 enough to allow the passage of gripper 18 therethrough.

It is noted that, in this embodiment, each side rail 64 is mounted on solid connector 74 and has a side translation unit 63 along side rail 64 via side translation unit 63. However, it should be emphasized that the movement of a pair of supporting arms into and out of the path of gripper 18 (and to any intermediate point as well) can be realized by any other suitable non linear motion, e.g., rotation.

According to a preferred embodiment, it is sufficient that each supporting arm have a single supporting base 26. However, FIG. 8 shows each supporting arm 24 and 26 with two supporting bases 26 and 27 which increases the buffering capacity of the buffer station, as will be described hereinbelow.

FIGS. 9A, 9B and 9C illustrate the operation of handling system 60. As illustrated by FIG. 9A, pair of supporting arms 62A is in the open position within the path of gripper 18 while pair of supporting arms 62B is in the closed position out of the path of gripper 18.

A measured wafer W1 is present on lower supporting bases 27B of pair of supporting arms 62B while a second wafer W2 is handled by gripper 18 e.g., is being measured or is being placed in a measuring position on measuring unit 15. Generally simultaneously, robot 8 arrives with a third wafer W3 to be measured, and places it on the uppermost supporting bases 26B of pair of supporting arms 62B.

As illustrated by FIG. 9B, when robot 8 finishes placing new wafer W3 on upper supporting bases 26B, robot 8 takes measured wafer W1 from lower supporting bases 27B and returns to conduct other missions. Generally simultaneously, pair of supporting arms 62A closes and gripper 18 places now measured second wafer W2 on supporting bases 27A.

As illustrated by FIG. 9C, pairs of supporting arms 62A and 62B change positions, such that pair of supporting arms 62B, with new wafer W3 thereon, enters the path of gripper 18 while pair of supporting arms 62A, with measured wafer W2 thereon, moves out of the path of gripper 18. Gripper 18 can now load third wafer W3 from upper supporting bases 26B and, once pair of supporting arms 62B opens up, can place new wafer W3 on measuring unit 15. When the measurement of the third wafer W3 is finished, it will be placed by gripper 18 onto supporting bases 27B and the buffering cycle continues. In the meantime, robot 8 can load measured wafer W2.

Thus, this buffering method enables robot 8 to unload a new wafer to be measured and to load a measured wafer, generally, while a third wafer is being handled by handling system 20. Thus, robot 8 and handling system 20 are relatively independent of each other in this embodiment.

Figure 10:
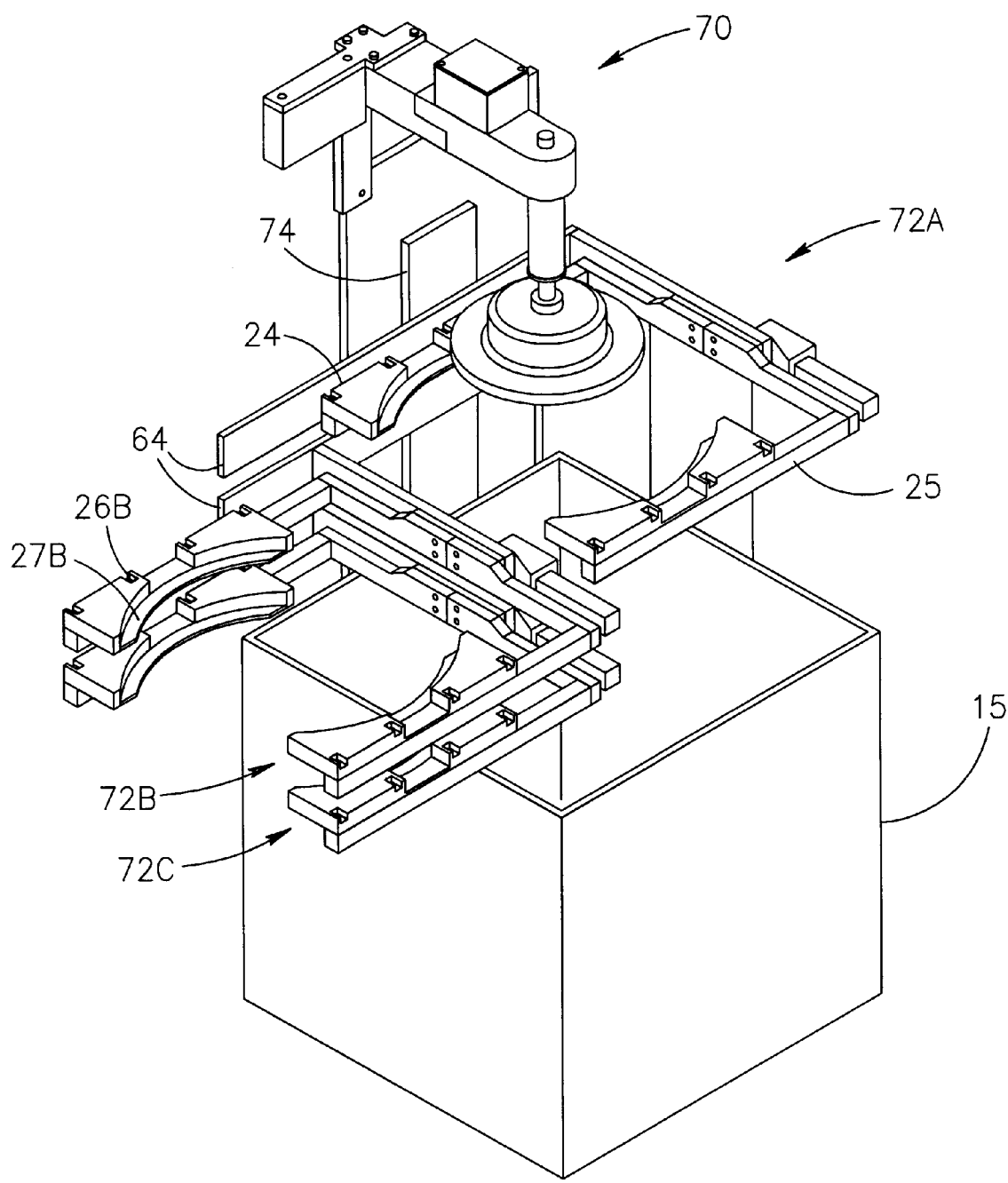
FIG. 10 is a schematic illustration of an integrated monitoring tool and handling system having three buffer stations, constructed and operative in accordance with a further preferred embodiment of the present invention.

Reference is made to FIGS. 10 and 11 which illustrate a further handling system 70 and its operation, respectively. In this embodiment handling system 70 comprises three pairs of supporting arms 72A, 72B and 72C, each formed in a manner similar to pairs of supporting arms 62 of the previous embodiment. Similar reference numerals refer to similar elements. Thus, each pair of supporting arms 72 has supporting beams 24 and 25 and each pair of supporting arms 72 moves between an in-path and an out-of-path position with respect to gripper 18. Typically, only one pair of supporting arms 72 is in the in-path position at any given time.

Figure 11A:
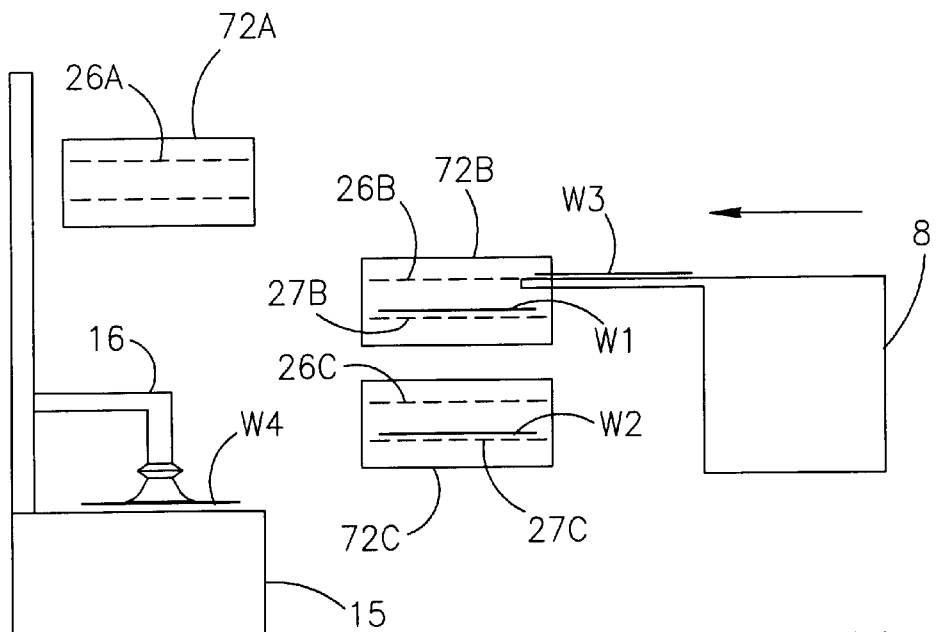
FIGS. 11A, 11B and 11C are schematic illustrations indicating a first operation of the system of FIG. 10.
Figure 11B:
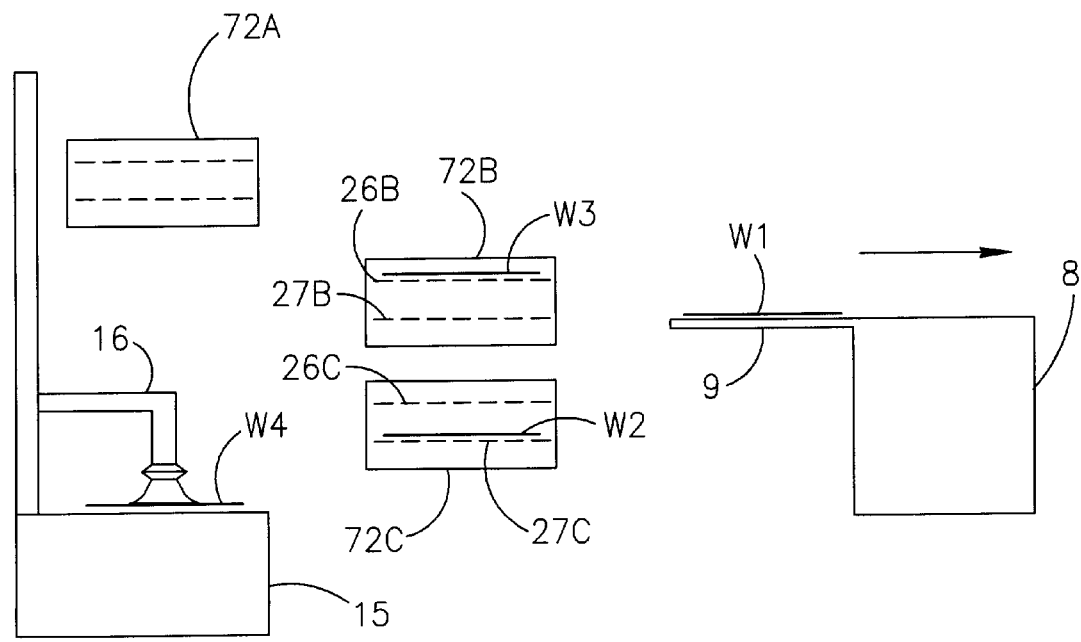
Figure 11C:
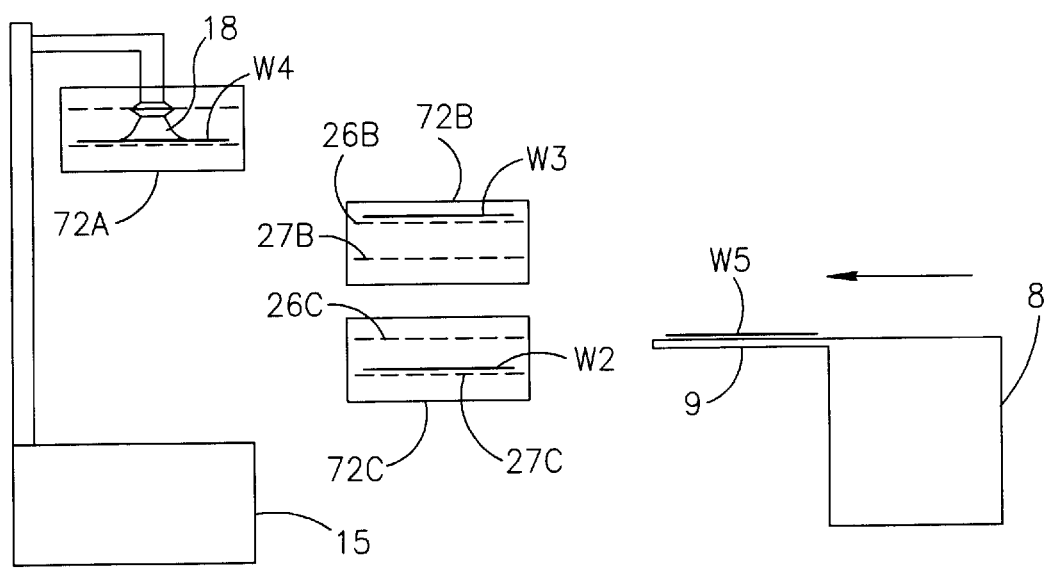

FIGS. 11A, 11B and 11C show the operation of handing system 70. This embodiment is particularly useful for a process environment with high throughput and thus, a high buffer capacity is needed to enable the operation of robot 8 and tool 6 to be sufficiently independent of each other.

FIG. 11A illustrates a point in time at which two measured wafers W1 and W2 are already present on the lower supporting bases 27B and 27C of out-of-path pairs of supporting arms 72B and 72C, respectively. At the same time, another wafer W4 is being handled by gripper 18 (e.g., it is being measured or it is being brought to or from measuring unit 15). Accordingly, pair of supporting arms 72A is open in the in-path position. FIG. 11A also shows robot 8 loading a new wafer W3 onto upper bases 26B of pair of supporting arms 72B.

As illustrated in FIG. 11B, when robot 8 finishes unloading and placing new wafer W3, it takes measured wafer W1 from lower supporting bases 27B of pair of supporting arms 72B and returns to its other missions. According to this preferred embodiment, robot 8 can generally immediately return back with a new wafer W5, as illustrated in FIG. 11C, and can place it on any available supporting base, such as base 27C.

While robot 8 is performing its operations, gripper 18 moves wafer W4 through the measurement process. Thus, it is shown on measuring unit 16 in FIG. 11B and on supporting bases 27A of closed pair of supporting arms 72A in FIG. 11C.

It is noted that, in general, pairs of supporting arms can be added to increase the buffer capacity of the handling system. It will be appreciated that, although two supporting bases are shown for each pair of supporting arms station, it is possible to have more or less, as needed.

Figure 12A:
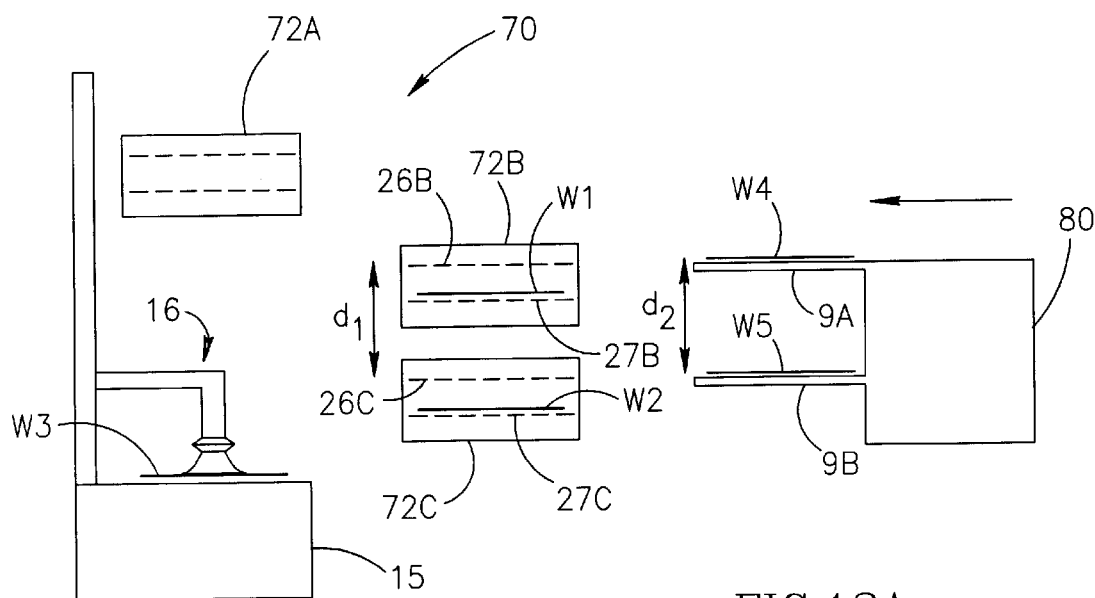
FIGS. 12A and 12B are schematic illustrations indicating a second operation of the system of FIG. 10 with a robot having two arms.
Figure 12B:
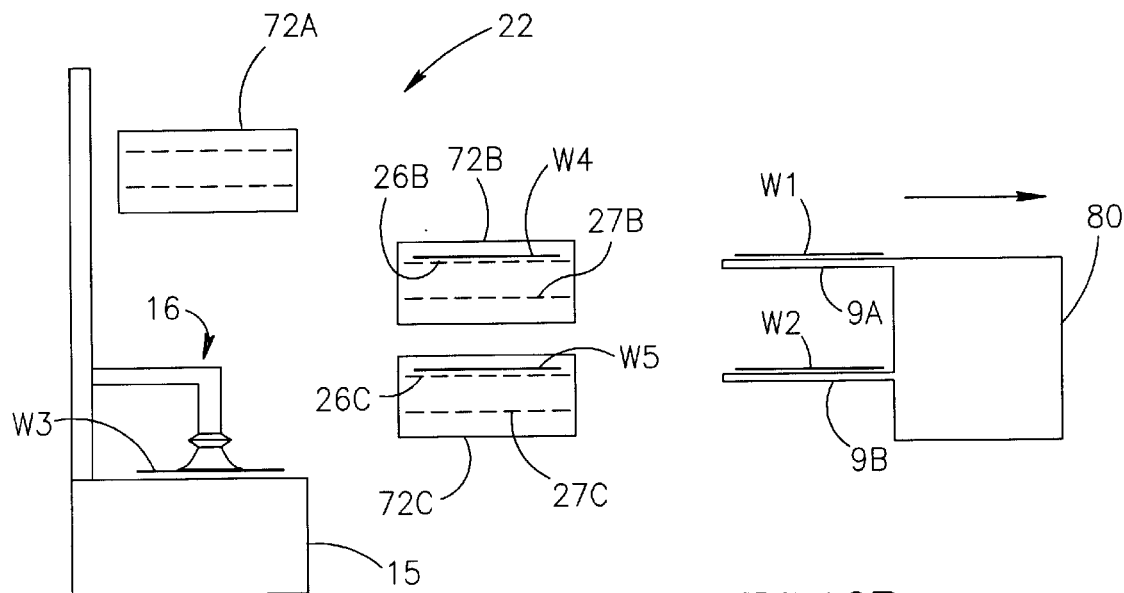

It will be appreciated that the present invention can operate with a robot 80 which can simultaneously carry two or more wafers (e.g., a semi or full wafer cassette). This is illustrated in FIGS. 12A and 12B to which reference is now made. The embodiment of FIGS. 12A and 12B uses handling system 70 of FIG. 10 and thus, similar reference numerals refer to similar elements.

In this embodiment, robot 80 must be able to simultaneously deliver all its wafers to the relevant buffer station, e.g., each wafer should be placed onto a different supporting base on different supporting arms. Therefore, as illustrated in FIG. 12A, two measured wafers W1 and W2 are present on the lower supporting bases 27B and 27C, respectively, while pairs of supporting arms 72B and 72C are in the out-of-path position. At the same time, another wafer W3 is handled by gripper 18 while pair of supporting arms 72A is in the in-path position. Generally simultaneously, robot 80 carries two new wafers W4 and W5 on its two arms 9A and 9B, respectively.

It is noted that a height difference d1 between upper supporting bases 27B and 27C of pairs of supporting arms 72B and 72C is generally equal to a height difference d2 between the wafers W4 and W5 carried on arm 9A and 9B of robot 80. When robot 80 arrives at pairs of supporting arms 72B and 72C, it can unload wafers W4 and W5 together to the upper supporting bases 26B and 26C and then it can load measured wafers W1 and W2 together from lower supporting bases 27B and 27C, after which it returns to the other missions, as illustrated in FIG. 12B.

It will be appreciated that each of the embodiments shown herein can also include pre-alignment unit 112 (FIGS. 6 and 7) and can perform the centering operations shown in FIGS. 5A and 5B.

It will be appreciated by persons skilled in the art that the present invention is not limited by what has been particularly shown and described herein above. Rather the scope of the invention is defined by the claims that follow:

What is claimed is:

1. A buffer station for a wafer handling system, the handling system having a general path along which it moves when handling the wafer, the buffer station comprising:
   at least one pair of supporting elements capable of supporting at least two wafers therebetween and located so as to support said wafers within said general path; and
   motion means for providing relative motion to said supporting elements such that, in a first mode, said supporting elements support any of said wafers placed thereon within said general path and, in a second mode, said supporting elements are sufficiently separated so as not to disturb the motion of said handling system when said handling system holds a wafer.

2. A buffer station according to claim 1 and wherein said supporting elements include at least two supporting bases each capable of holding a wafer thereon when said supporting elements are in said first mode.

3. A buffer station according to claim 2 and wherein each of said supporting elements include at least one supporting base each capable of holding a wafer thereon when said supporting elements are in said first mode.

4. A buffer station according to claim 3 and wherein said at least one supporting base including two supporting bases.

5. A buffer station for a wafer handling system, the handling system having a general path along which it moves when handling the wafer, the buffer station comprising:
   at least two pairs of supporting elements each capable of supporting at least one wafer therebetween and located so as to support said wafer within said general path; and
   one motion means per pair of supporting elements shifting its associated pair of supporting elements in and out of said general path and when said supporting elements are in said general path, for providing relative motion to its associated pair of supporting elements such that, in a first mode, said supporting elements support said wafer within said general path and, in a second mode, said supporting elements are sufficiently separated so as not to disturb the motion of said handling system when said handling system holds a wafer.

6. A buffer station according to claim 5 and wherein said at least two pairs of supporting elements includes three pairs of supporting elements.

* * * * *